United States Patent [19]
Rolfson

[11] Patent Number: 5,576,126
[45] Date of Patent: Nov. 19, 1996

[54] PHASE SHIFTING MASK

[75] Inventor: J. Brett Rolfson, Boise, Id.

[73] Assignee: Micron Technology, Inc., Boise, Id.

[21] Appl. No.: 550,459

[22] Filed: Oct. 30, 1995

Related U.S. Application Data

[62] Division of Ser. No. 312,408, Sep. 26, 1994, Pat. No. 5,468,578.

[51] Int. Cl.$^6$ ................................................ G03F 9/00
[52] U.S. Cl. ............................ 430/5; 430/314; 430/322; 430/324
[58] Field of Search ......................... 430/5, 314, 322, 430/323, 324

[56] References Cited

U.S. PATENT DOCUMENTS

| | | | |
|---|---|---|---|
| 5,045,417 | 9/1991 | Okamoto | 430/5 |
| 5,079,113 | 1/1992 | Ohta et al. | 430/5 |
| 5,126,220 | 6/1992 | Tokitomo et al. | 430/5 |
| 5,194,344 | 3/1993 | Cathey et al. | 430/5 |
| 5,194,345 | 3/1993 | Rolfson et al. | 430/5 |
| 5,194,346 | 3/1993 | Rolfsen et al. | 430/5 |
| 5,208,125 | 5/1993 | Lowrey et al. | 430/5 |
| 5,217,830 | 6/1993 | Lowrey | 430/5 |
| 5,240,796 | 8/1993 | Lee et al. | 430/5 |
| 5,255,035 | 10/1993 | Rolfsen | 156/643 |
| 5,281,500 | 1/1994 | Cathey et al. | 430/5 |
| 5,288,568 | 2/1994 | Cathey, Jr. | 430/5 |
| 5,318,868 | 6/1994 | Hasegawa et al. | 430/5 |

*Primary Examiner*—S. Rosasco
*Attorney, Agent, or Firm*—Stephen A. Gratton

[57] ABSTRACT

An improved method of fabricating a phase shifting mask suitable for semiconductor manufacture includes the steps of identifying phase conflict areas in a desired mask pattern and forming phase shift bands in the phase conflict areas. Phase conflict areas occur in transparent areas of the mask pattern which are in close proximity to one another and which have the same phase. More specifically, the method of the invention includes the steps of: depositing an opaque layer (i.e., chrome) on a transparent substrate, etching openings in the opaque layer to form a pattern of transparent areas and opaque areas, connecting adjacent transparent areas together in the phase conflict areas, and forming phase shift areas in every other transparent area and in the connecting areas.

21 Claims, 11 Drawing Sheets

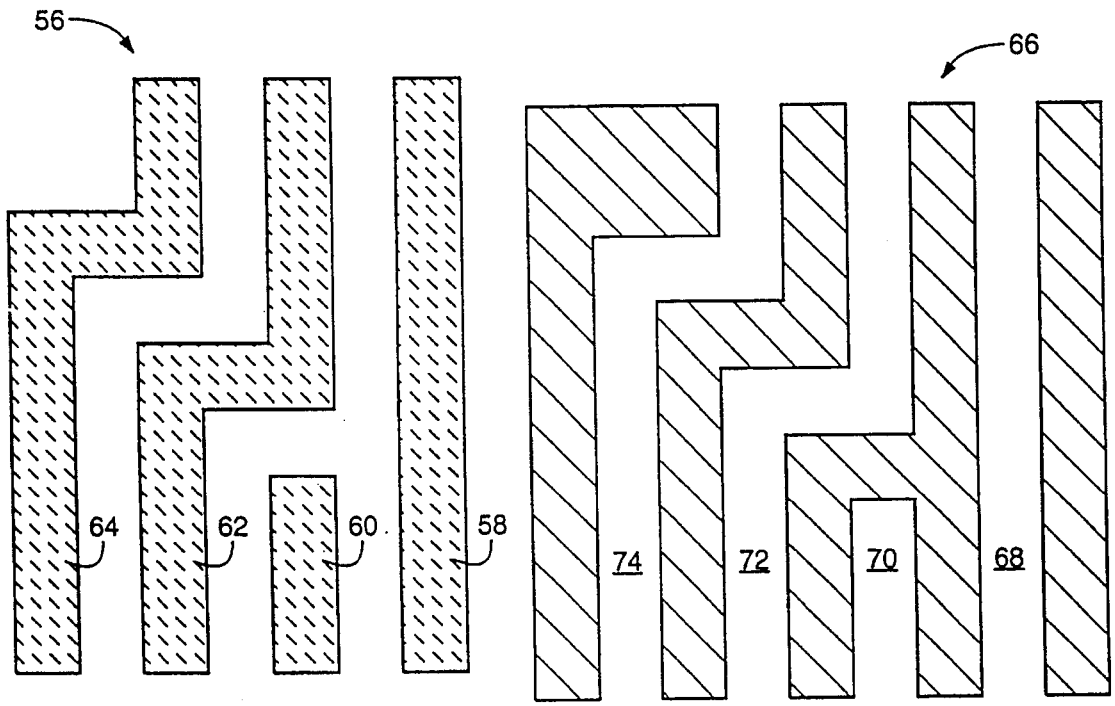
FIG. 6
(PRIOR ART)
FIG. 7
(PRIOR ART)
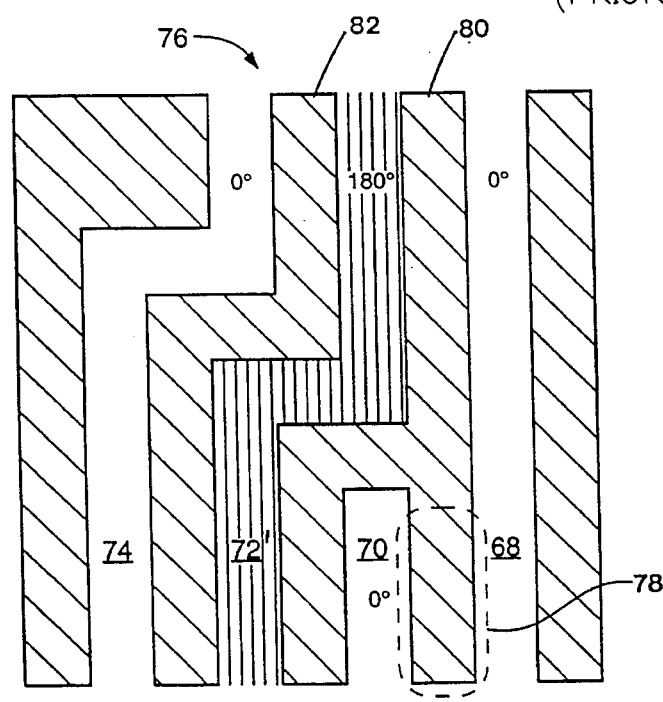
FIG. 8
(PRIOR ART)

PHASE SHIFTING MASK

This invention was made with Government support under Contract No. MDA972-92-C-0054 awarded by Advanced Research Projects Agency (ARPA). The Government has certain rights in this invention.

CROSS REFERENCE TO RELATED APPLICATIONS

This application is a division of application Ser. No. 08/312,408 filed Sep. 26, 1994 now U.S. Pat. No. 5,468,578.

FIELD OF THE INVENTION

This invention relates to optical lithography and more particularly to the fabrication of masks or reticles which are used in optical lithography. The method of the invention is particularly suited to the fabrication of phase shifting masks for semiconductor manufacture.

BACKGROUND OF THE INVENTION

In semiconductor manufacture, micro lithography is used in the formation of integrated circuits on a semiconductor wafer. During a lithographic process, a form of radiant energy such as ultraviolet light, is passed through a mask or reticle and onto the semiconductor wafer. The mask contains opaque and transparent areas or regions formed in a predetermined pattern. A grating pattern, for example, may be used to define parallel spaced conducting lines on a semiconductor wafer. The ultraviolet light exposes the mask pattern on a layer of resist formed on the wafer. The resist is then developed for removing either the exposed portions of resist for a positive resist or the unexposed portions of resist for a negative resist. The patterned resist can then be used during a subsequent semiconductor fabrication process such as ion implantation or etching.

FIG. 1 illustrates a complex photoresist pattern 10 that has been formed on a portion of a semiconductor wafer using an optical lithographic technique. In FIG. 1, areas on the wafer that are covered with photoresist are shaded with diagonal dashed lines. The photoresist pattern 10 formed on the wafer includes a repetitive arrangement of generally T-shaped sections 12A–D shaped substantially as shown. The T-shaped sections 12A–D are arranged in mirror image pairs. In addition, a pair of parallel spaced borders 14 are situated generally perpendicular to the T-shaped sections 12A–D and frame the lower portion of the pattern 10. Another pair of parallel spaced borders 14A, formed as mirror images of borders 14, frame the upper portion of the pattern 10. The borders have an irregular peripheral configurations substantially as shown.

If a positive photoresist is used, the photoresist which forms the T-shaped sections 12A–D and borders 14, 14A would correspond to opaque regions on the mask. The remaining areas of the wafer have no photoresist and would correspond to transparent or light transmissive areas on the mask. Light passing through these transparent areas of the mask pattern during the photolithographic process functions to develop the positive photoresist which is then removed. Conversely for a negative tone photoresist, the areas of the wafer having photoresist (T-shaped sections 12A–D, borders 14, 14A) would correspond to the transparent areas of the mask.

With reference to FIG. 2, a mask pattern 16 suitable for developing a negative tone resist into the photoresist pattern 10 illustrated in FIG. 1 is shown. In FIG. 2, the opaque areas of the mask pattern 16 have diagonal solid lines and transparent areas are clear. The mask pattern 16 includes transparent areas formed with mirror image pairs of T-shaped sections 18A–D, and parallel spaced borders 20, 20A shaped substantially as shown. As before, the borders 20, 20A frame the T-shaped sections 18A–D and are perpendicular to the T-shaped sections 18A–D. The transparent areas of the mask pattern 16 are used for developing the negative tone photoresist that remains in the desired pattern 10 (FIG. 1) on the wafer.

Such a conventional mask arrangement works well for forming semiconductor structures having feature sizes that are larger than about 0.5μ. As microcircuit densities have increased, however, the size of the features of semiconductor devices, such as those represented by the photoresist pattern 10 of FIG. 1, have decreased to the sub micron level. These sub micron features may include the width and spacing of metal conducting lines or the size of various geometric features of active semiconductor devices. The requirement of sub micron features in semiconductor manufacture has necessitated the development of improved lithographic processes and systems. One such improved lithographic process is known as phase shift lithography.

With phase shift lithography the interference of light rays is used to overcome diffraction and improve the resolution and depth of optical images projected onto a target. In phase shift lithography, the phase of an exposure light at the object is controlled such that adjacent bright areas are formed preferably 180 degrees out of phase with one another. Dark regions are thus produced between the bright areas by destructive interference even when diffraction would otherwise cause these areas to be lit. This technique improves total resolution at the object (i.e. wafer) and allows resolutions as fine as 0.25 μm to occur.

Whereas a conventional lithographic mask contains only transparent and opaque areas, a phase shifting mask is constructed with a repetitive pattern formed of three distinct areas or layers of material. An opaque layer provides areas that allow no light transmission, a light transmission layer provides areas which allow close to 100% of light to pass through and a phase shift layer provides areas which allow close to 100% of light to pass through but phase shifted 180 degrees ($\pi$) from the light passing through the light transmissive areas. The light transmissive areas and phase shift areas are situated such that light rays diffracted from the edges of the opaque layer and through the light transmissive and phase shift areas is canceled out in a darkened area there between. This creates a pattern of dark and bright areas which can be used to clearly delineate features of a pattern defined by the mask on a photopatterned semiconductor wafer.

Recently, different techniques have been developed in the art for fabricating different types of phase shifting masks. One type of phase shifting mask, named after a pioneer researcher in the field, M. D. Levenson, is known as a "Levenson" or "alternating aperture" phase shift mask. Such a mask is typically formed on a transparent substrate such as polished quartz. An opaque layer, formed of a material such as chromium, is deposited on the transparent substrate and etched with a pattern of apertures. This forms opaque areas on the mask which combined with the pattern of apertures carry the desired pattern. With a phase shifting mask the transparent areas and phase shifting areas are formed within the apertures in an alternating pattern with respect to the opaque areas.

The phase shift areas of the mask pattern may be formed by depositing a phase shifting material into every other aperture (i.e. additive process). Alternately, phase shift areas may be formed by etching a groove in every other aperture (i.e. subtractive process). With this type of phase shift structure the light passing through a grooved aperture travels a shorter distance in the substrate relative to light passing through an adjacent aperture formed over the full thickness of the substrate. Light beams exiting adjacent apertures of the mask therefore have a phase difference. This phase difference is preferably 180° ($\pi$), or whole multiple thereof, so that the light waves cancel out at the wafer. The thicknesses of the substrate for the phase shift areas and light transmission areas of a mask pattern can be calculated by the formula:

$$t = i\lambda/2(n-1)$$

where t=thickness i=an odd integer $\lambda$=wavelength of exposure light n=refractive index of substrate at the exposure wavelength With reference to FIG. 2A, a prior art phase shifting mask pattern 22 for a Levenson (alternating aperture) phase shifting mask is shown. The phase shifting mask may be formed on a transparent substrate (e.g., quartz) having an opaque material (e.g. chromium) deposited thereon. Opaque areas of the mask pattern are represented by the diagonal shading, light transmissive areas are clear and phase shift areas have vertical shading.

As with the previous mask pattern 16 (FIG. 2), the phase shift mask pattern 22 (FIG. 2A) includes transparent areas formed with mirror image pairs of T-shaped sections 24A–D and parallel spaced borders 26, 26A. As represented by the vertically shaded areas, every other T-shaped section 24B, 24D and every other border 26, 26A is formed as a phase shift area. The phase shift areas alternate with light transmission areas wherein no phase shift occurs (i.e., alternating apertures). Phase shifting may be accomplished by forming the phase shift areas (or alternately the light transmission areas) as grooves in the substrate to a predetermined depth. Alternately a phase shift material may be deposited on the substrate to form the phase shift areas.

Because of their complexity, phase shifting mask patterns are often generated using automated computer aided design techniques (Auto-CAD). As an example, the technical article entitled "Investigating Phase-Shifting Mask Layout Issues Using a CAD Toolkit" by Wong et al., International Electron Devices Meeting, Washington, D.C., Dec. 8–11, 1991, described a CAD design process for phase shift masks.

One problem with a phase shifting mask constructed with such a complex mask pattern 22 is that there are numerous phase conflict areas which cause the projected image to become degraded. In general, a phase conflict occurs where two areas of the same phase occur together on the mask pattern 22 in very close proximity. Two of these phase conflict areas for adjacent 0° areas are designated as 28 and 30. Two of these phase conflict areas for adjacent 180° areas are designated 28A and 30A.

The opaque material in the phase conflict areas, such as opaque sections 32, 34, 32A, 34A may have a relatively narrow width which is below the resolution limit for the system. These narrow width opaque sections (32, 34, 32A, 34A) will therefore not "resolve" and the feature represented by the opaque material will not print clearly on the wafer.

For this reason, phase shifting lithography may not provide satisfactory results for many complex patterns used in semiconductor manufacture.

In view of this and other problems, there is a need in the art for improved phase shifting masks suitable for forming complex patterns. Accordingly, it is an object of the present invention to provide an improved method of making phase shifting masks for photolithography. It is a further object of the present invention to provide an improved phase shifting mask in which the resolution of projected features in phase conflict areas is improved. It is a still further object of the present invention to provide an improved method for making phase shifting masks which is adaptable to large scale semiconductor manufacture and which is compatible with Auto-Cad mask layout techniques.

SUMMARY OF THE INVENTION

In accordance with the present invention an improved method of fabricating phase shifting masks and an improved phase shifting mask suitable for semiconductor photolithography are provided. The method of the invention, simply stated, comprises the steps of: identifying phase conflict areas in a desired phase shifting mask pattern; depositing an opaque layer on a transparent substrate and etching openings through the opaque layer to the substrate to form a mask pattern of opaque areas and transparent areas; connecting together adjacent transparent areas of the mask pattern in the phase conflict areas; and forming phase shifting areas in every other opening and in the connected transparent areas. The method of the invention is suitable for fabricating an alternating aperture, or Levenson, phase shifting mask.

Initially, phase conflict areas of a desired mask pattern are identified. This may be done manually using techniques that are known in the art or by using Auto-Cad mask layout techniques. As previously stated, phase conflict areas are areas on the mask pattern of the same phase which are in close proximity to one another. One or more partial mask pattern is then formed on a transparent substrate, such as quartz, using a staged or multiple write photolithographic process. This involves depositing an opaque layer on the substrate and opening up transparent areas in the opaque layer by patterning and etching. Phase shift areas are then formed in the transparent areas by etching or other suitable techniques.

During the staged photolithographic process a partial or intermediate mask pattern is formed on the substrate. The partially completed mask pattern includes transparent connecting sections which connect transparent areas of the same phase in the phase conflict areas. Phase shift bands are then formed in the connected transparent areas and in other areas of the pattern as required. Depending on the complexity of the mask pattern, the staged photolithographic process for forming the mask pattern may include two or more writes.

Various objects, advantages and capabilities of the present invention will become more apparent from the following more particular description of the preferred embodiments of the invention as illustrated in the accompanying drawings.

BRIEF DESCRIPTION OF THE DRAWINGS

FIG. 6 is a schematic view of another prior art photoresist pattern formed on a semiconductor wafer;

FIG. 7 is schematic view of a prior art mask pattern suitable for use in optical lithography for forming the photoresist pattern of FIG. 6 using a negative tone resist;

FIG. 8 is a schematic view of a prior art phase shifting mask pattern for forming the photoresist pattern of FIG. 6;

DETAILED DESCRIPTION OF THE PREFERRED EMBODIMENTS

Figure 3:
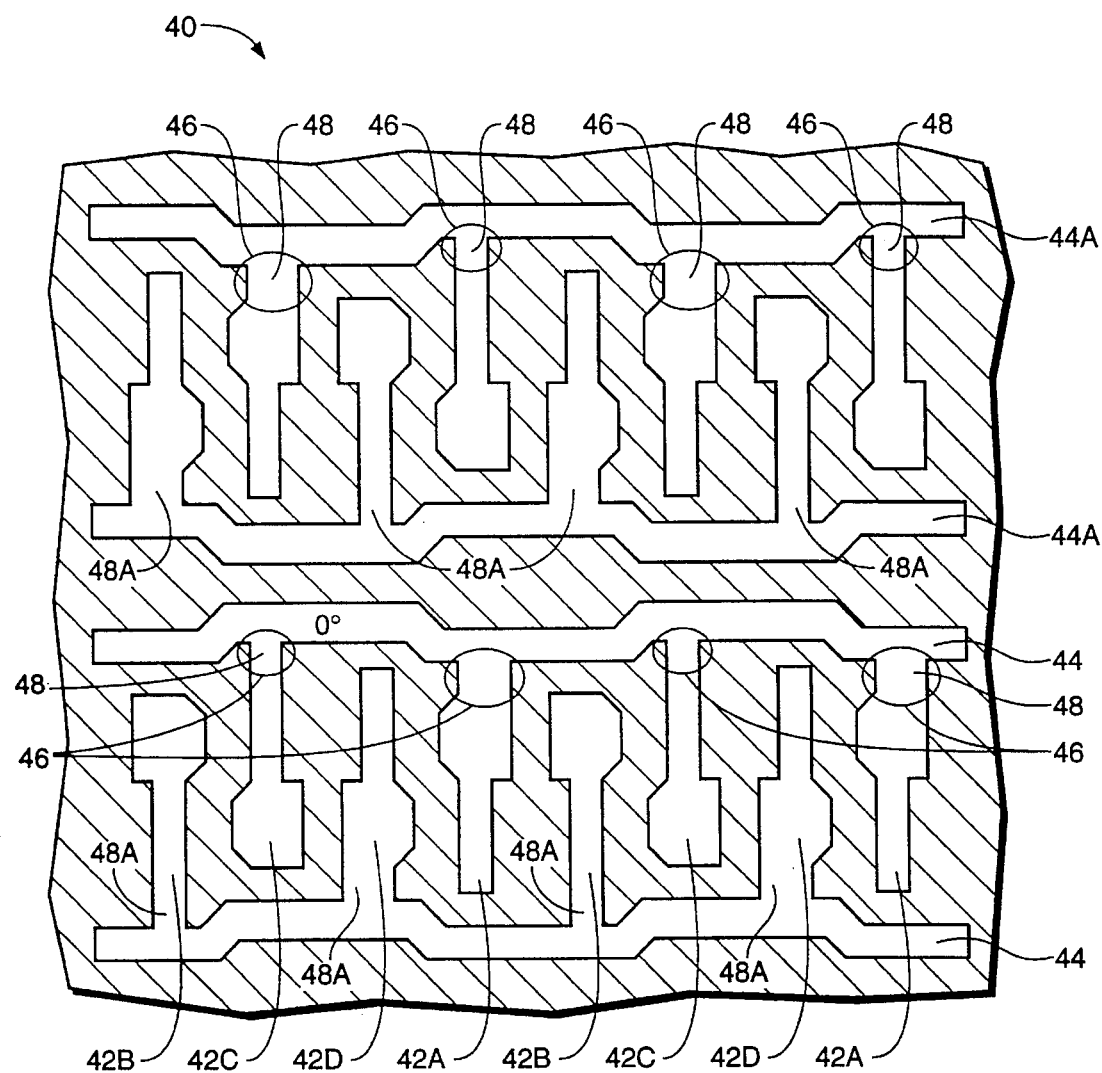
FIG. 3 is a schematic view of a partially completed mask pattern shown during the formation of a mask in accordance with the method of the invention.
Figure 4:
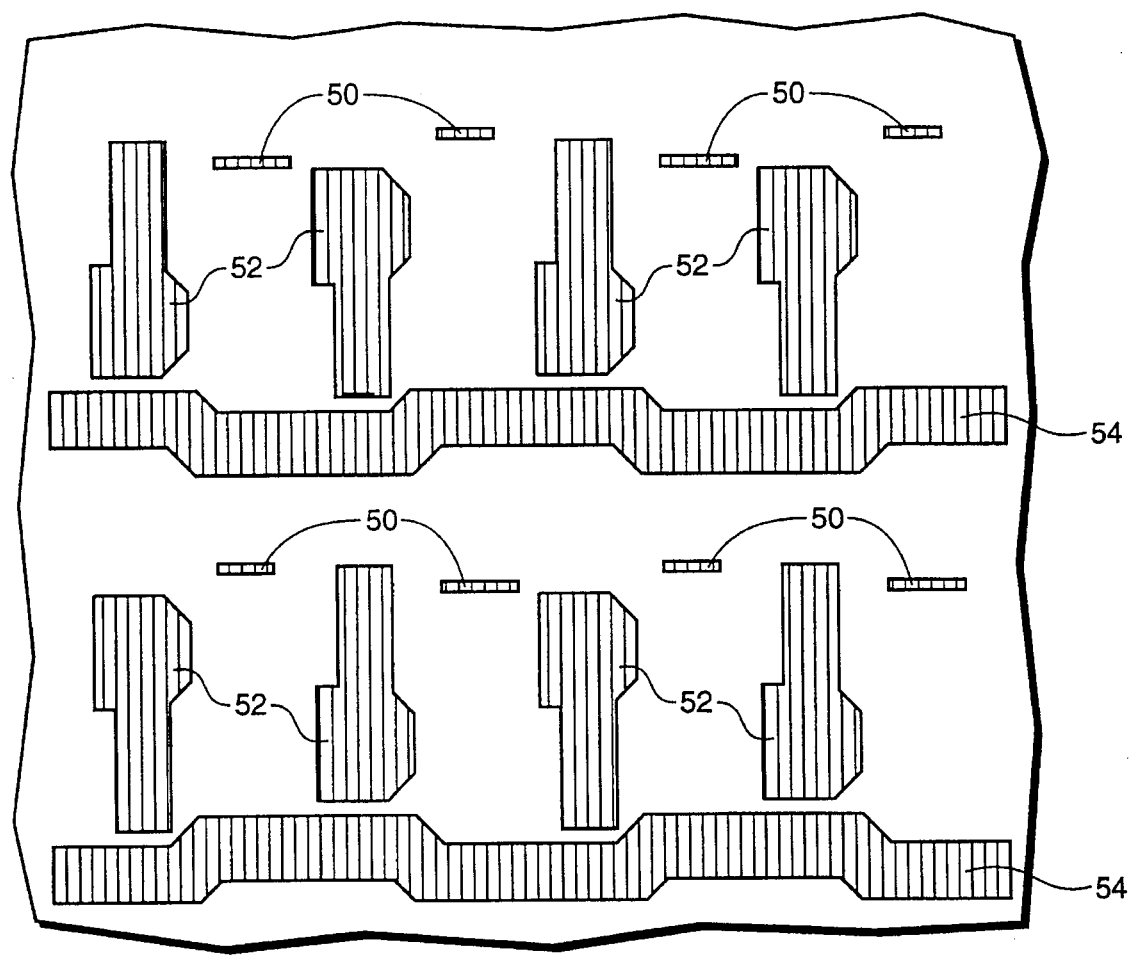
FIG. 4 is a schematic view showing the location of phase shifting areas for the mask pattern of FIG. 3.
Figure 5:
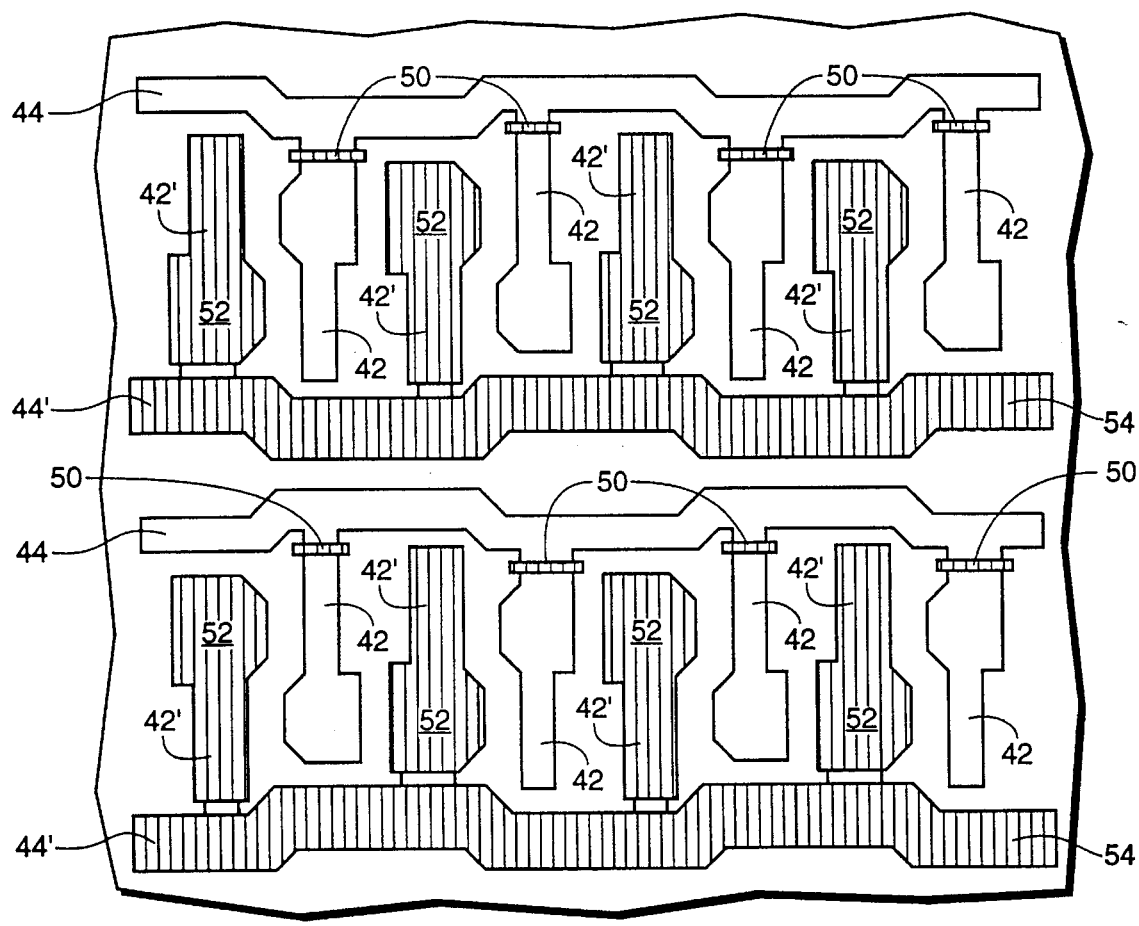
FIG. 5 is a schematic view showing the location of transparent areas for the mask pattern of FIG. 3 with the transparent areas overlaid with phase shifting areas.

With reference to FIGS. 3, 4 and 5, the method of the invention is illustrated in the formation of a phase shifting mask pattern 40. The completed phase shifting mask pattern 40' (FIG. 5) is adapted to form the photoresist pattern 10 (FIG. 1) on a semiconductor wafer. FIG. 3 illustrates the mask pattern 40 in a partially completed condition during the first write of a two write process. The partially completed mask pattern 40 includes T-shaped sections 42A–D and borders 44, 44A. The T-shaped sections 42A–D and borders 44, 44A are transparent for developing a negative tone resist. The remainder of the mask pattern 40 is opaque.

The mask pattern 40 shown in FIG. 3 can be formed using conventional mask fabrication techniques. As an example, a mask structure for forming the mask pattern 40 may include a transparent substrate such as polished quartz having a layer of an opaque material such as chromium deposited thereon. The opaque layer may be deposited on the transparent substrate using a conventional process such as electron beam deposition (EBD), chemical vapor deposition (CV) or sputtering.

A photolithographic process may be used to pattern the opaque layer to form the mask pattern 40. The opaque layer may be patterned by deposition of a layer of photoresist which is exposed in the desired pattern and then etched to remove the unwanted portions of the opaque layer. Writing the photoresist in the desired pattern may be by techniques that are known in the art, such as with E-beam writing or laser pattern writing. Etching may be with a dry plasma etch or similar process. The method of the invention preferably includes a staged etch process wherein the opaque layer along with the phase shift areas are written and etched multiple times.

In accordance with the method of the invention, phase conflict areas 46 in the desired mask pattern are initially identified. Phase conflict areas occur on a phase shifting mask where two areas of the same phase occur in close proximity. The phase conflict areas 46 may be identified using Auto-Cad techniques which are known in the art. One suitable technique for identifying phase conflict areas in mask patterns is described in the previously cited technical article by Wong et al. presented at the 1991 IEDM Conference which is incorporated here by reference.

In the partially completed mask pattern illustrated in FIG. 3, phase conflict areas 46 occur in areas between the T-shaped sections 42A–D and the borders 44, 44A. In accordance with the method of the invention, transparent connecting sections 48 are formed in the phase conflict areas 46. The transparent connecting sections 48 connect the T-shaped sections 42A–D and borders 44, 44A in the phase conflict areas 46. In addition, transparent connecting sections 48A connect the T-shaped sections 42A–D and borders 44, 44A where there is no phase conflict.

Next, every other transparent T-shaped section 42B, 42D and every other border 44, 44A, as the pattern may require, is formed as a phase shift area 50 and 52 (FIG. 4). Phase shift areas may be formed using a subtractive process in which the transparent substrate is etched to a reduced thickness. Alternately an additive process wherein phase shifting material is deposited on the substrate may be utilized. In either case, an alternating pattern of transparent phase shift areas and transparent light transmission areas is formed.

In addition, to forming every other T-shaped section 42B, 42D and every other border 44, 44A as a phase shift area 52 and 54, the transparent connecting sections 48 which are in phase conflict area 46 are formed as phase shift bands 50 (FIG. 4). FIG. 4 illustrates the pattern of phase shift areas separate from other elements of the mask 40. These include phase shift bands 50, T-shaped phase shift areas 52 and border phase shift areas 54.

FIG. 5 illustrates the pattern of phase shift areas overlaid with the transparent areas and opaque areas of the mask pattern. In FIG. 5 the phase transparent shift areas are shaded with vertical lines. Note that the phase shift areas that overlay the light transmission areas (e.g., phase shift areas 52 overlay light transmission areas 42B and 44D respectively) are larger than the light transmission areas. This provides a phase shifting effect around the edges of the pattern exposed on the wafer by the light transmission areas.

Referring now to FIGS. 6–10, the method of the invention is illustrated in connection with another pattern. FIG. 6 shows a desired prior art photoresist pattern 56 to be printed on a semiconductor wafer. In FIG. 6 areas of the wafer covered with photoresist have diagonal shading and areas with no photoresist have no shading. The photoresist pattern 56 includes parallel spaced rectangular sections 58, 60 and parallel spaced zigzag sections 62, 64. Each of these sections 58, 60, 62, 64 is formed of photoresist.

FIG. 7 shows a prior art mask pattern 66 suitable for forming the photoresist pattern 56 of FIG. 6 using a negative tone resist. In FIG. 7, the opaque areas of the mask pattern 66 have diagonal shading and the transparent areas have no shading. The transparent rectangular sections 68, 70 in FIG. 7 will produce the rectangular photoresist sections 58, 60 (FIG. 6) on the wafer. In a similar manner the transparent zigzag sections 72, 74 will produce the zigzag photoresist sections 62, 64 (FIG. 6) on the wafer.

For the sub micron dimensioning required for VLSI and ULSI applications this mask pattern 66 may not reproduce satisfactorily. Specifically the thin rectangular sections or the spaces inbetween these sections may not resolve on the photoresist pattern. Because of this, phase shifting lithographic techniques may be employed to achieve a higher resolution with smaller feature sizes.

FIG. 8 shows a prior art phase shifting mask pattern 76 suitable for forming the photoresist pattern 56 of FIG. 6 using a negative tone resist. This is the same mask pattern 66 as shown in FIG. 7 but with transparent section 72 formed as a 180° phase shift area 72'. Transparent sections 68 and 70 are still formed to provide no (i.e. 0°) phase shift and function as light transmission areas.

The phase shift area 72' and transparent section 74 cooperate to sharpen the image defined by the opaque material 82 therebetween. With his arrangement, however, a phase conflict area 78 is situated between transparent sections 68 and 70. For patterns having sub micron dimensions, the opaque material 80 in the phase conflict area 78 will likely not resolve onto the wafer.

Figure 9:
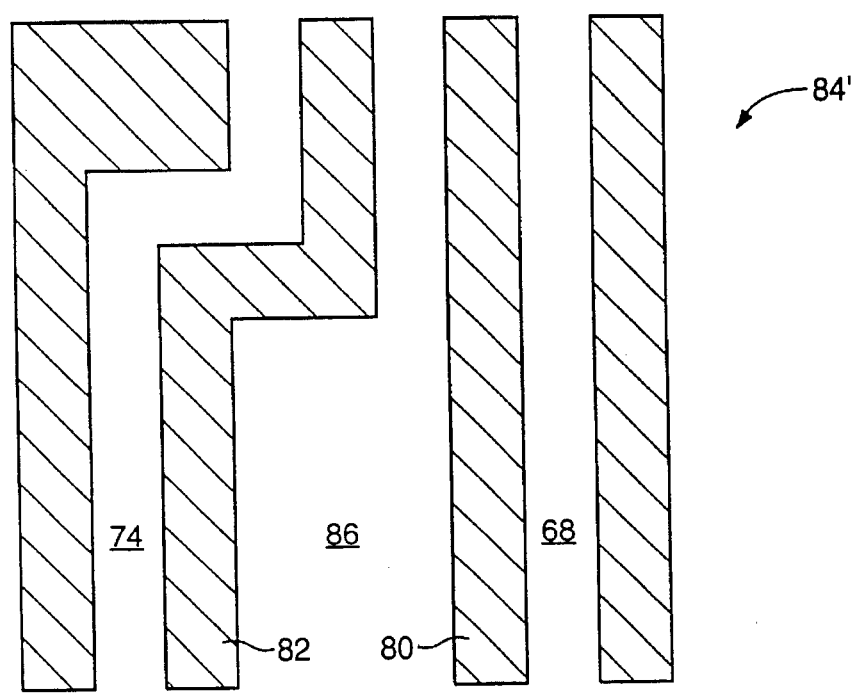
FIG. 9 is a schematic view of a partially completed phase shifting mask pattern for forming the photoresist pattern of FIG. 6 shown after the first write of a two write process used in fabricating a mask in accordance the invention.
Figure 10:
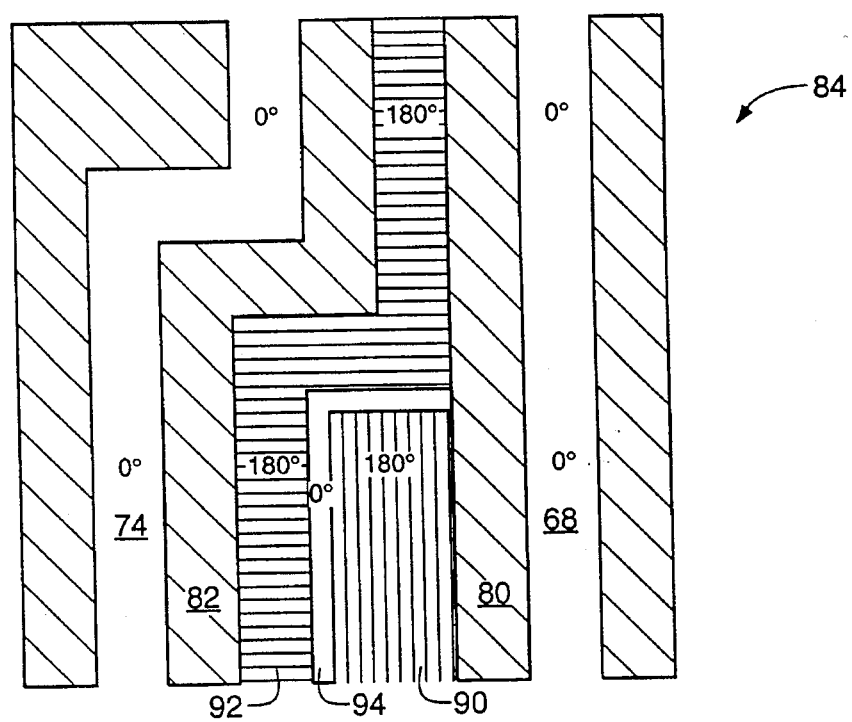
FIG. 10 is a schematic view similar to FIG. 9 showing a completed phase shifting mask pattern after the second write.

FIGS. 9 and 10 illustrate the formation of a phase shifting mask pattern in accordance with the method of the invention that overcomes this limitation of prior art phase shift masks. A two write process is disclosed wherein the mask pattern is written or etched in two stages utilizing a photopatterning and etching process substantially as previously described. During a first write shown in FIG. 9, the binary mask pattern 84' (i.e., patterned chrome) is partially formed by photopatterning and etching the opaque material. During a second write shown in FIG. 10, the mask pattern 84 is completed by photopatterning and etching the 180° phase shifting areas.

As before, phase conflict areas 78 (FIG. 8) are initially identified. Following identification of the phase conflict areas, the mask pattern is partially formed with transparent portions of the pattern joined together in the phase conflict areas. As shown in FIG. 9, the partially completed mask pattern 84' includes a large generally H-shaped transparent area 86. This partially completed mask pattern 84' is formed on the first write of a two write process. The partially completed mask pattern 84' differs from the prior art pattern 76 (FIG. 8) in that an L-shaped opaque section 88 is absent and transparent areas 70 and 72 are formed continuously.

During the second write, and as shown in FIG. 10, two separate 180° phase shifting areas are formed in the large transparent area 86. Specifically, a first rectangular shaped phase shift area 90 and a second zigzag shaped phase shift area 92 are formed. As before, these are chromeless phase shift structures which may be formed by etching the mask substrate to a predetermined depth. (Alternately for an additive process a phase shift material may be added). These 180° phase shift areas 90 and 92 do not intersect but are separated by an L-shaped 0° transparent area 94.

The L-shaped 0° transparent area 94 cooperating with the two larger 180° phase shift areas to create overlapping nulls. This will produce a corresponding L-shaped section of photoresist on the wafer when using a negative tone resist.

The L-shaped 0° transparent area 94 of mask pattern 84 (FIG. 10) thus functions in the same manner as the L-shaped opaque section 88 of prior art mask pattern 76 (FIG. 8).

Figure 11A:
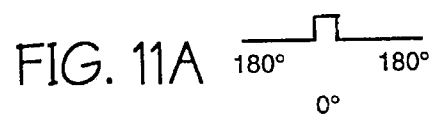
FIG. 11A is a schematic cross section of the mask pattern shown in FIG. 10.
Figure 11B:
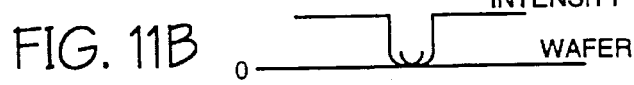
FIG. 11B is a schematic view showing the intensity of the electric field on a wafer using the completed mask pattern of FIG. 10 in a lithographic process.

The function of the overlapping nulls is shown in FIGS. 11A and 11B. FIG. 11A is a schematic cross section of the mask pattern 84 (FIG. 10) showing the L-shaped 0° transparent area 94 bounded on either side by phase shift areas 90 and 92. In FIG. 11B, the intensity of the electric field at the wafer is zero in the area which corresponds to the L-shaped 0° transparent area 94. The photoresist in this area will thus be unexposed and for a negative tone resist will be removed from the wafer.

Figure 1:
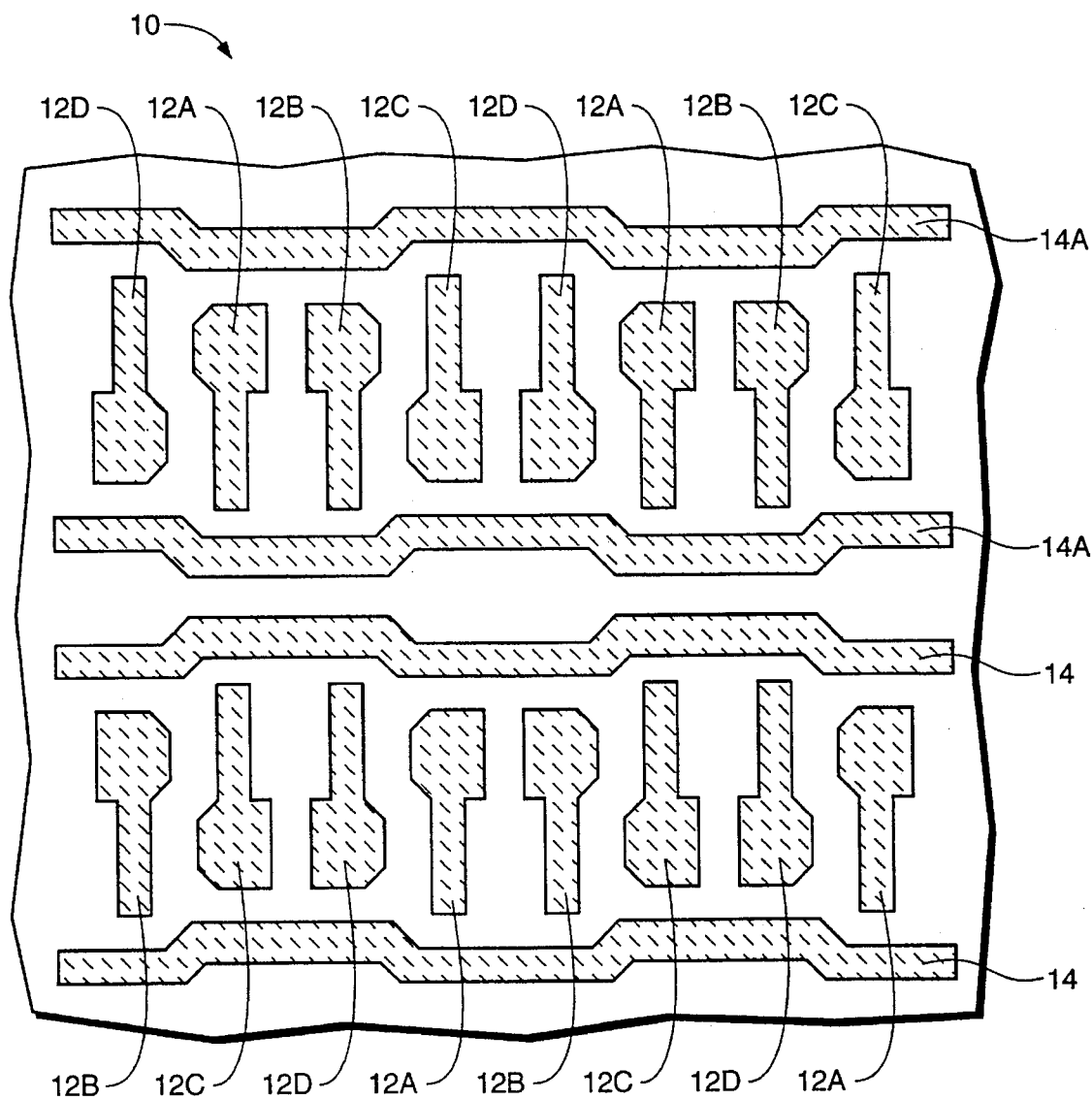
FIG. 1 is a schematic view of a prior art complex photoresist pattern formed on a semiconductor wafer.

Referring now to FIGS. 12–15, the method of the invention is illustrated with a four write process for forming the mask pattern. The four write process is a photolithographic patterning and etching process substantially as previously described but with four separate patterning and etching steps for forming openings in the mask pattern and phase shifters in the openings. The completed mask pattern is suitable for forming a negative tone photoresist pattern on a wafer equivalent to the complex pattern 10 which is shown in FIG. 1.

Figure 12:
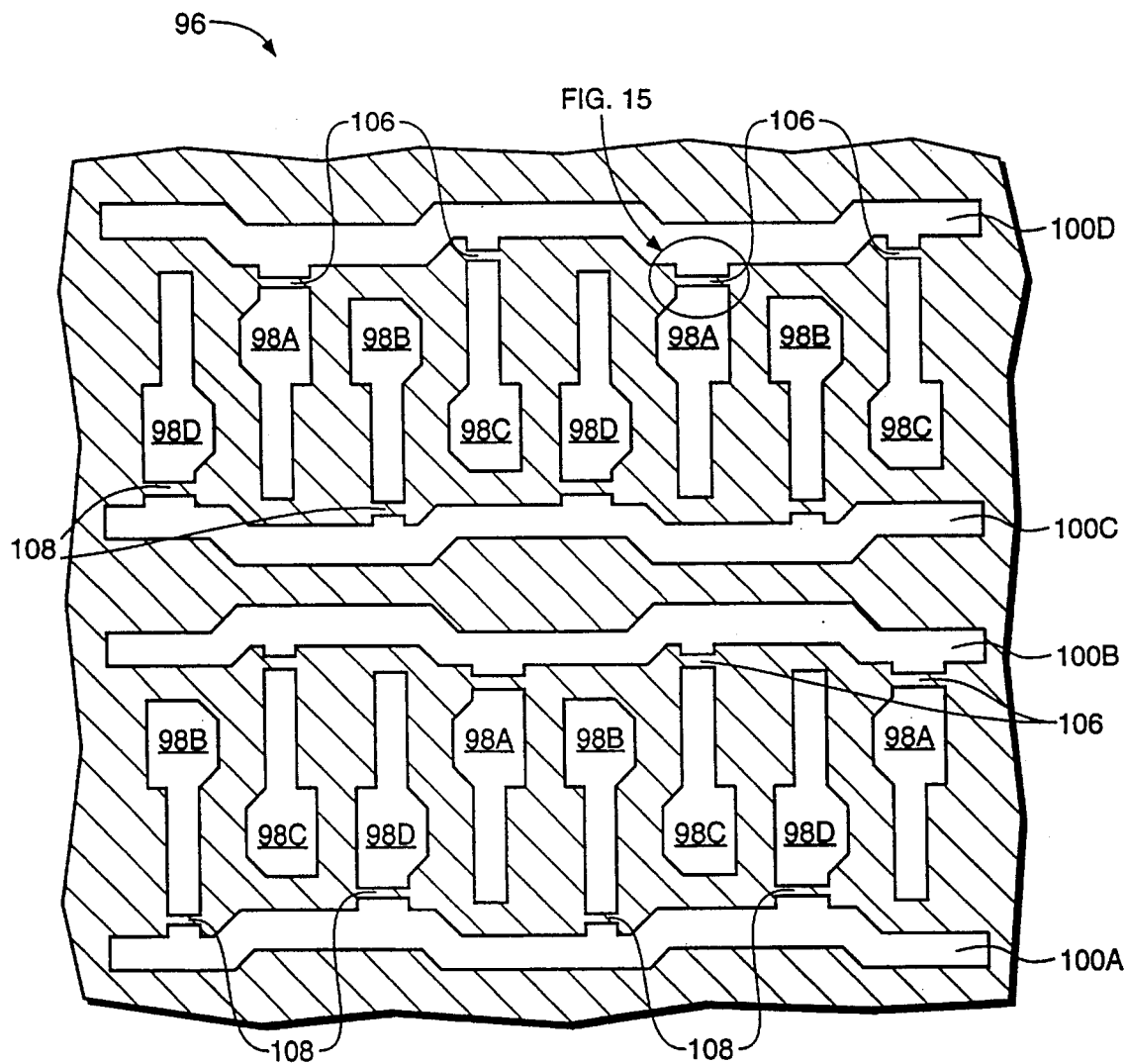
FIG. 12 is a schematic view of a partially completed mask pattern for a mask constructed in accordance with the invention shown after the first write of a four write process.

FIG. 12 illustrates a partially completed mask pattern 96 during the first write of the four write photolithographic process. This four write process forms substantially the same mask pattern as the previously described two write process (FIGS. 9–11B) but self alignment of the features is improved. For forming the mask pattern 96 an opaque layer such as chromium is deposited on a transparent quartz substrate. The opaque layer is then patterned and etched during the first write of the photolithographic process to form the binary mask pattern (e.g., chrome pattern on quartz). In FIG. 12, transparent areas of the mask pattern 96 are clear and opaque areas of the mask pattern 96 are shaded with diagonal hatching. During the first write of the photolithographic process, the main transparent areas of the mask pattern 96 are opened up. As before, these main transparent areas include T-shaped sections 98A–D and pairs of parallel spaced borders 100A–D.

Figure 2:
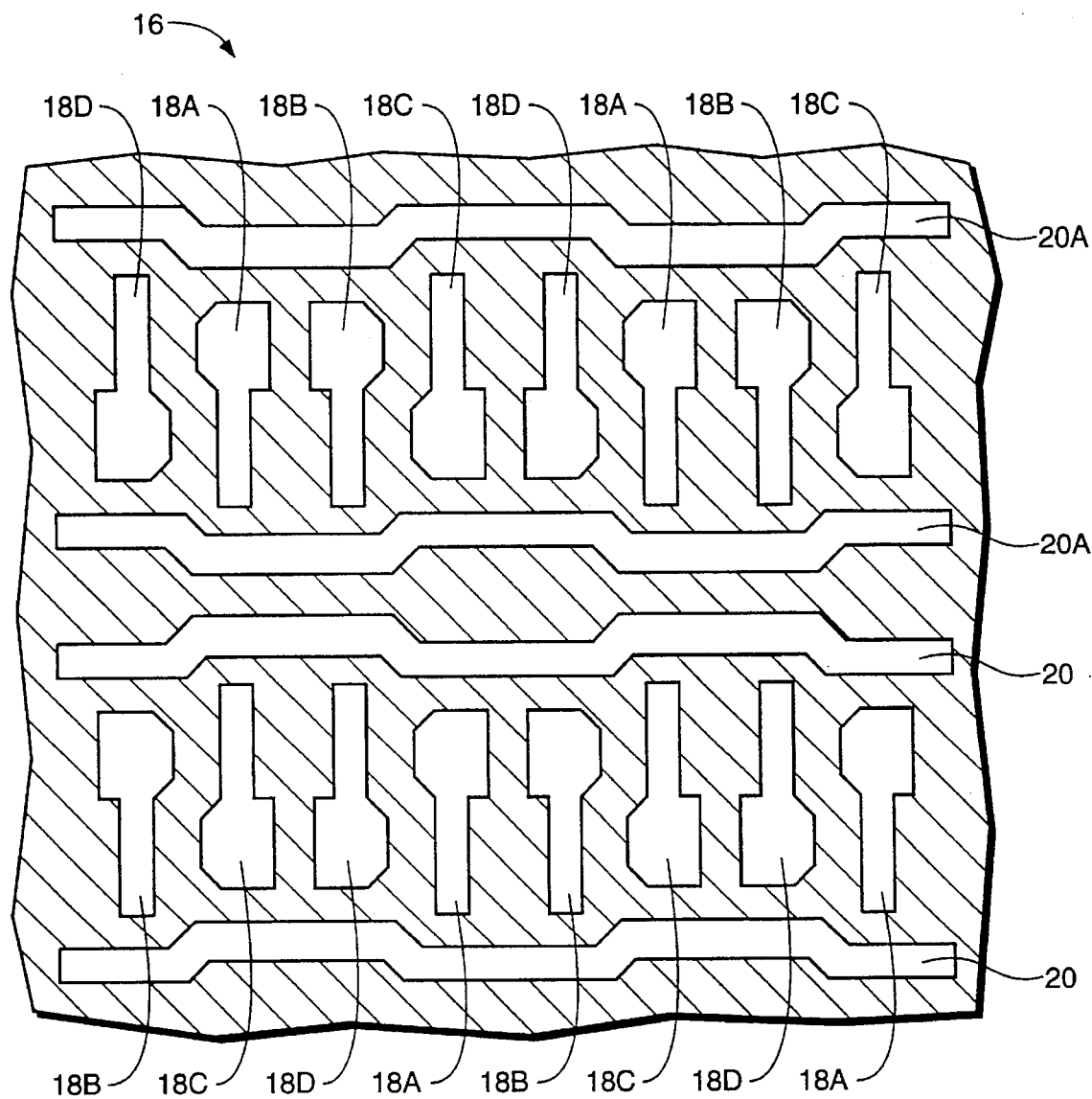
FIG. 2 is a schematic view of a prior art mask pattern for use in an optical lithographic system and suitable for forming the complex pattern shown in FIG. 1 using a negative tone resist.
Figure 2A:
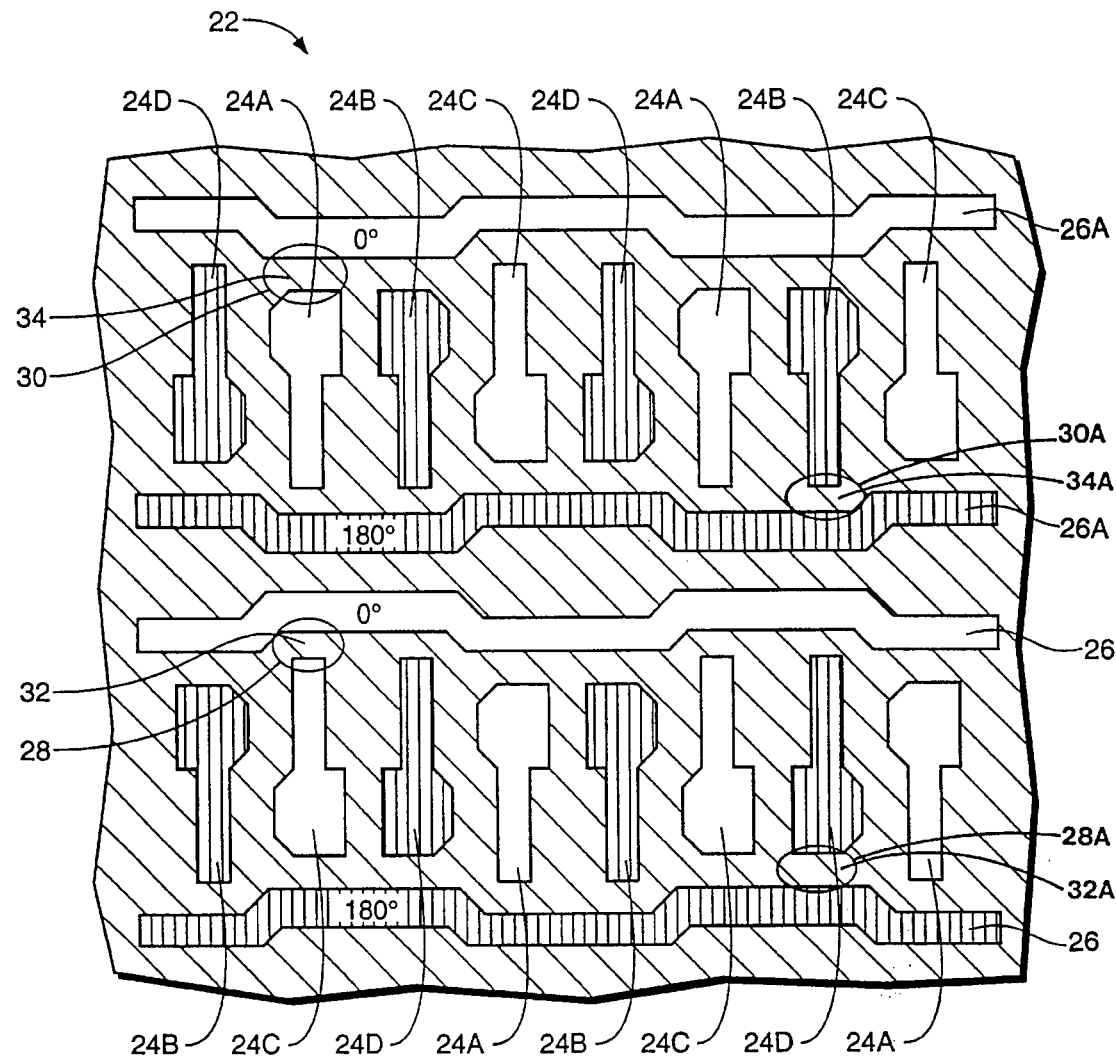
FIG. 2A is a schematic view of a prior art alternating aperture phase shifting mask pattern for forming the complex pattern shown in FIG. 1.
Figure 15:
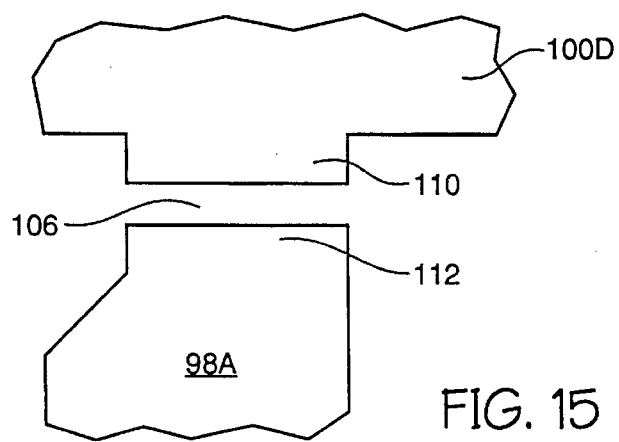
FIG. 15 is an enlarged schematic view of a portion of FIG. 12 showing an opaque connecting section.

The transparent sections of the mask pattern 96 are shaped substantially the same as with the prior art mask pattern shown in FIG. 2A. One difference however, is that the T-shaped sections 98A–D and borders 100A–D are shaped such that thin opaque connecting sections are formed therebetween. These connecting sections include upper connecting sections 106 and lower connecting sections 108. One opaque connecting section 106 for an upper end of a T-shaped section 98A is shown in detail in FIG. 15. As shown in FIG. 15, in order to form the upper opaque connecting section 106 shown, transparent border 100D includes a rectangular projection 110 that extends into the opaque area of the mask pattern. In a similar manner, transparent T-shaped section 98A includes a mating rectangular projection 112 that extends into the opaque area of the mask pattern.

Similar thin projecting structures are formed at the lower ends of the T-shaped sections 98A–D to form opaque connecting sections 108 (FIG. 12). During a subsequent write these thin opaque connecting sections 106, 108 will be removed to form connecting transparent sections between the T-shaped sections 98A–D and borders 10A–D.

Figure 13:
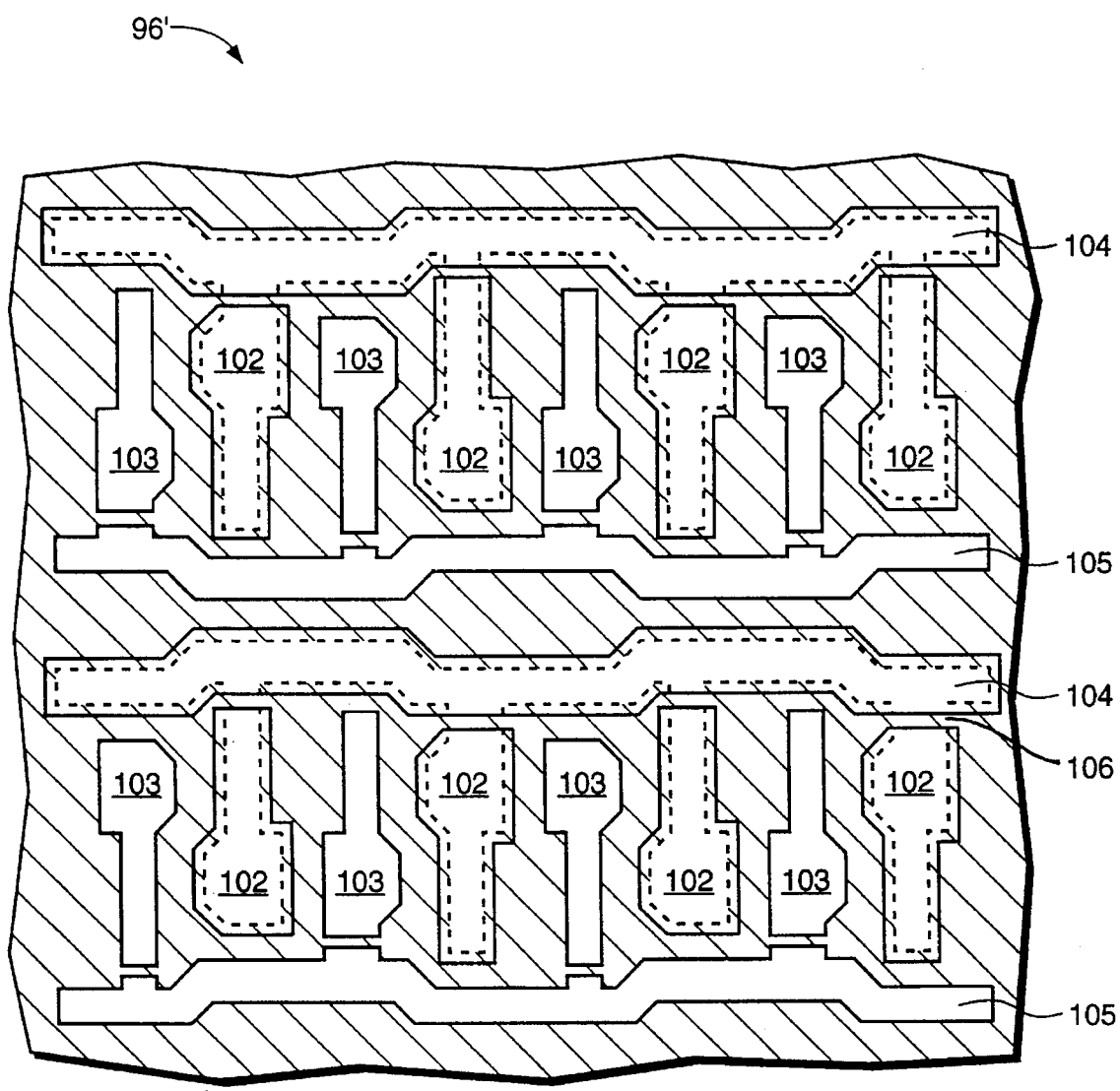
FIG. 13 is a schematic view of a partially completed mask pattern shown after the second write of the four write process.

FIG. 13 illustrates the partially completed mask pattern 96' during the second write of the four write photolithographic process. During the second write the quartz substrate in every other T-shaped area 102 and in every other border 104 in the opaque layer is etched to form 180° phase shifter.

During this etch step the remaining T-shaped areas 103 and borders 105 are covered with resist and are protected from the etch. In the completed mask pattern, areas 102, 104 will be phase shift areas and areas 103, 105 will be light transmission areas. These future phase shift areas 102, 104 are larger than the corresponding light transmission areas 103, 105. In FIG. 13, the transparent areas of the mask pattern upon which the phase shift areas 102, 104 have been formed are shown in dotted lines.

Figure 14:
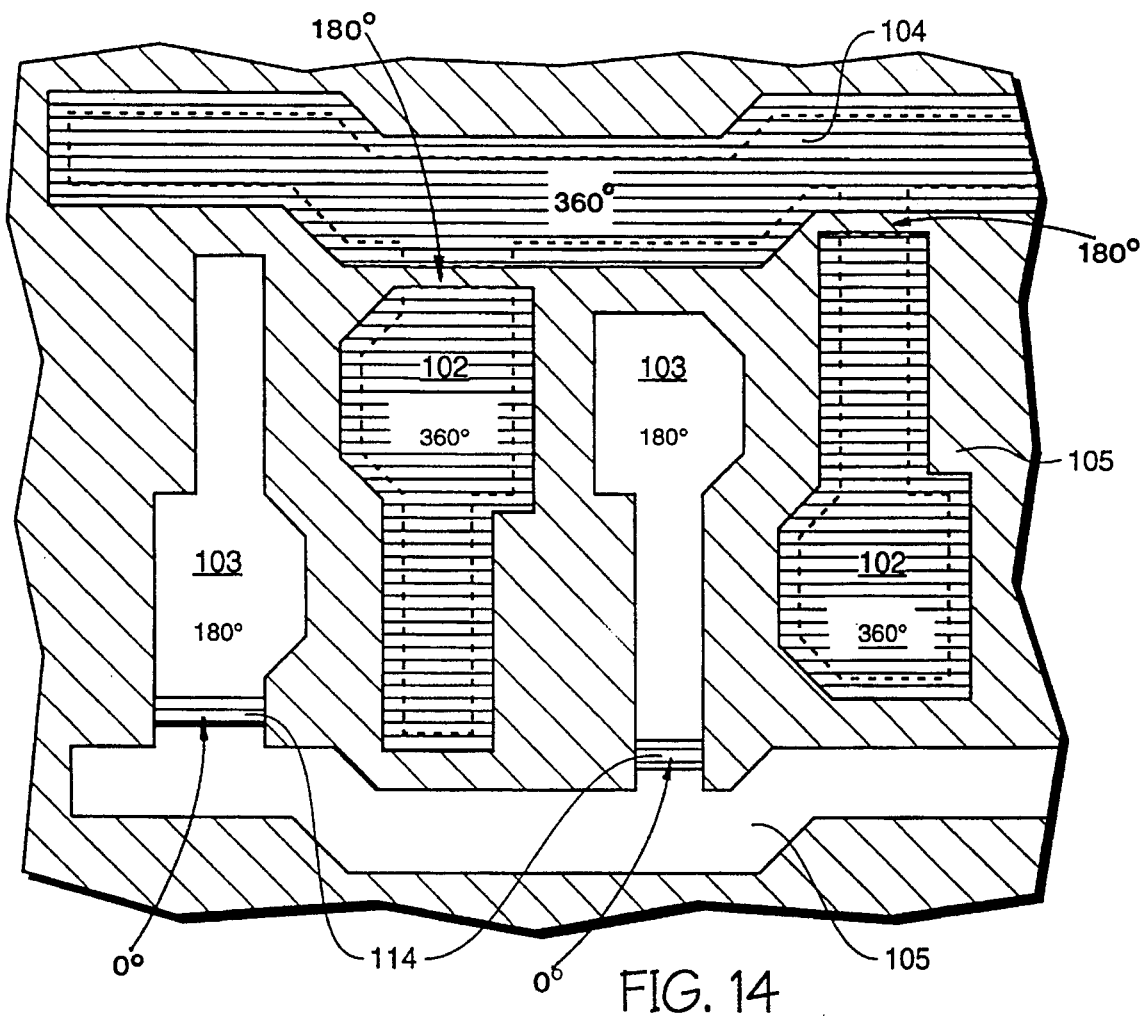
FIG. 14 is an enlarged schematic view, showing the mask pattern after a third and fourth write of the four write process.

FIG. 14 is an enlarged view illustrating a portion of the completed mask pattern following the third and fourth writes of the four write process. During the third write the upper opaque connecting sections 106 (FIG. 12) are removed by covering everything but the connecting section 106 with resist and then etching away the opaque material (e.g., chrome). Following removal of the opaque connecting sections 106, the resist used to etch the opaque connecting sections 106 is removed. A blanket 180° etch is then performed in the T-shaped phase shift areas 102 and in the border phase shift areas 104. During this etch, the T-shaped phase shift areas 102 and border phase shift areas 104 previously etched to 180°, are etched to 360° and become phase shifters (horizontal shading) in the completed mask pattern. At the same, the T-shaped light transmission areas 103 and border light transmission areas 105 are etched to only 180° by the blanket etch and become the light transmission areas in the completed mask pattern.

Next, during a fourth write, the lower opaque connecting sections 108 (FIG. 12) and additional phase conflict areas formed during the third write are etched to form 0° phase shift bands 114.

The completed mask pattern is substantially the same as the completed mask pattern 40 shown in FIG. 5. Specifically, 180° areas and alternating 360° phase shift areas are formed. In addition, connecting phase shift areas or 0° phase shift bands 114 are formed in the areas of phase conflict. As is apparent, the 0° areas will produce the same phase of light as the 360° areas. Light passing through a 0° or 360° area will be out of phase by from light passing through a 180° areas.

The four write process can be summarized as follows:

1st write: Pattern and etch opaque layer to form binary mask (e.g., chrome and quartz).

2nd write: Open areas to be shifted 180° by etching substrate to 180°.

3rd write: Open "phase bands" at 180° conflict areas and etch away opaque material. Strip the resist and do a blanket 180° substrate etch.

4th write: Remove chrome at new 180° conflict areas that were created by 3rd write and remove opaque material in phase conflict areas to form phase bands.

Although the method of the invention has been described in connection with the fabrication of exemplary mask patterns, it is to be understood that the inventive concepts expressed herein can be utilized for forming other mask patterns including complex patterns. In addition, although the phase shift areas described herein have been formed using a subtractive process (i.e., etching phase shift grooves) it is to be that understood that an additive process can also be used to form phase shift areas (i.e., deposition of a phase shift material). Furthermore, although the method of the invention has been described using a negative tone photoresist, it is to be understood that a positive photoresist could also be used.

Thus while the process of the invention has been described with reference to certain preferred embodiments, as will be apparent to those skilled in the art, certain changes and modifications can be made without departing from the scope of the invention as defined by the following claims.

What is claimed is:

1. A phase shifting mask comprising:

a transparent substrate;

a pattern of transparent areas formed by an opaque layer formed on the substrate with a pattern of openings;

a pattern of connecting transparent areas which connect adjacent transparent areas occurring in phase conflict areas; and a first pattern of phase shifters formed in every other transparent area; and a second pattern of phase shifters formed in the connecting transparent areas for separating features in the phase conflict areas.

2. The mask as claimed in claim 1 and wherein the phase shifters are formed using a subtractive process wherein the substrate is grooved.

3. The mask as claimed in claim 1 and wherein the phase shifters are formed using an additive process wherein a phase shift material is deposited on the substrate.

4. The mask as claimed in claim 1 and wherein the mask is formed using a photolithographic process in which the opaque layer is covered with resist and photopatterned, and the opaque layer and substrate are etched in stages.

5. The mask as claimed in claim 4 and wherein the photolithographic process includes a first write wherein the pattern of openings in the opaque layer is formed and a second write wherein the connecting transparent areas are formed.

6. The mask as claimed in claim 5 and wherein the photolithographic process includes a third write wherein the connecting transparent areas are formed, and a fourth write wherein phase shift bands are formed in the connecting transparent areas.

7. The mask as claimed in claim 1 and wherein the connecting transparent areas include overlapping phase shift areas separated by a transparent band such that during a lithographic process employing the phase shifting mask an intense null is formed at the transparent band.

8. The mask as claimed in claim 1 and wherein the phase conflict areas are identified using an Auto Cad technique.

9. A phase shifting mask comprising:

a transparent substrate;

an opaque layer deposited on the substrate and having a pattern of openings forming transparent features;

phase shifters formed on every other transparent feature;

phase conflict areas wherein transparent features having a same phase occur in close proximity;

a pattern of connecting transparent areas which connect adjacent transparent areas occurring in the phase conflict areas; and connecting phase shifters formed in the connecting transparent areas for separating features in the phase conflict areas.

10. The phase shifting mask as recited in claim 9 and wherein the phase shifters are formed as etched grooves.

11. The phase shifting mask as recited in claim 9 and wherein the phase shifters are formed by a layer of material deposited on the substrate.

12. The phase shifting mask as recited in claim 9 and wherein the phase conflict areas are identified using an Auto Cad technique.

13. The phase shifting mask as recited in claim 9 and wherein the mask is formed for photopatterning a wafer with a negative tone resist.

14. The phase shifting mask as recited in claim 9 and wherein the mask is formed for photopatterning a wafer with a positive tone resist.

15. An alternating aperture phase shifting mask formed by a method comprising:

identifying areas of phase conflict in a desired phase shifting mask pattern wherein areas of a same phase occur in close proximity;

depositing an opaque layer on a transparent substrate;

photopatterning and etching the opaque layer to form a mask pattern that includes transparent areas and opaque areas;

etching every other transparent areas to form an alternating pattern of phase shift areas;

photopatterning and etching connecting transparent areas between adjacent transparent areas of the mask pattern in the phase conflict areas; and photopatterning and etching phase shift bands in the connecting transparent areas for separating features in the phase conflict areas.

16. The phase shifting mask as recited in claim 15 and wherein photopatterning and etching the opaque layer is during a first write, photopatterning and etching every other transparent area is during a second write, photopatterning and etching connecting transparent areas is during a third write, and etching phase shift bands is during a fourth write.

17. The phase shifting mask as recited in claim 16 and wherein during the second write the substrate is etched to phase shift light by 180° and during the third write the 180° the substrate is etched to phase shift light by 360°.

18. The phase shifting mask as recited in claim 17 and wherein the phase shift bands formed during the fourth write are adapted to phase shift light by 0°.

19. The phase shifting mask as recited in claim 18 and wherein identifying areas of phase conflict is with an Auto CAD technique.

20. The phase shifting mask as recited in claim 19 and wherein the phase shift areas are formed by a subtractive process.

21. The phase shifting mask as recited in claim 19 and wherein the phase shift areas are formed by an additive process.

* * * * *